United States Patent
Hashimoto et al.

(10) Patent No.: US 6,746,888 B2
(45) Date of Patent: Jun. 8, 2004

(54) DISPLAY AND FABRICATING METHOD THEREOF

(75) Inventors: Makoto Hashimoto, Kanagawa (JP); Hisashi Kadota, Kanagawa (JP); Hirohide Fukumoto, Kagoshima (JP); Takusei Sato, Tokyo (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 10/259,410

(22) Filed: Sep. 30, 2002

(65) Prior Publication Data

US 2003/0020064 A1 Jan. 30, 2003

Related U.S. Application Data

(62) Division of application No. 09/698,087, filed on Oct. 30, 2000, now Pat. No. 6,501,096.

(30) Foreign Application Priority Data

Mar. 1, 2000 (JP) ...................................... P2000-055161

(51) Int. Cl.[7] .......................... H01L 21/84; H01L 21/31; H01L 21/311; H01L 21/4763
(52) U.S. Cl. .......................... 438/30; 438/149; 438/152; 438/609; 438/622; 438/632; 438/633; 438/692; 438/698; 438/699; 438/782
(58) Field of Search ................... 438/30, 149, 152–153, 438/609, 622, 631–633, 692, 697–699, 780–782

(56) References Cited

U.S. PATENT DOCUMENTS

| 6,057,896 | A | * | 5/2000 | Rho et al. ...................... 349/42 |
| 6,057,897 | A | * | 5/2000 | Ichikawa et al. .............. 349/48 |
| 6,075,580 | A | * | 6/2000 | Kouchi ....................... 349/110 |
| 6,078,366 | A | * | 6/2000 | Dohjo et al. ................... 349/43 |
| 6,246,070 | B1 | * | 6/2001 | Yamazaki et al. ............. 257/40 |
| 6,261,971 | B1 | * | 7/2001 | Maekawa et al. ........... 438/766 |
| 6,278,131 | B1 | * | 8/2001 | Yamazaki et al. ............. 257/59 |
| 6,329,672 | B1 | * | 12/2001 | Lyu et al. ....................... 257/59 |
| 6,348,368 | B1 | * | 2/2002 | Yamazaki et al. .......... 438/166 |
| 6,482,684 | B1 | * | 11/2002 | Yamazaki .................... 438/158 |
| 6,555,420 | B1 | * | 4/2003 | Yamazaki .................... 438/158 |
| 2002/0132399 | A1 | * | 9/2002 | Shibata et al. .............. 438/151 |
| 2002/0179908 | A1 | * | 12/2002 | Arao ........................... 257/72 |

OTHER PUBLICATIONS

Wolf, Ph.D., Stanley, "Multilevel–Interconnect Technology for VLSI and ULSI," Silicon Processing for the VLSI Era—vol. 2: Process Integration, Lattce Press, 1990, pp. 229–236 and 238–239.*

* cited by examiner

Primary Examiner—Amir Zarabian
Assistant Examiner—Toniae M. Thomas
(74) Attorney, Agent, or Firm—Rader, Fishman & Grauer PLLC; Ronald P. Kananen

(57) ABSTRACT

A transmission type display includes a thin film transistor for driving a pixel electrode, which transistor is provided on a substrate, and a conductive shield layer provided at a position over the thin film transistor and under the pixel electrode. A first planarization film is formed to bury an irregular contour of the thin film transistor and the shield layer is disposed on the planarized surface of the first planarization film, and a second planarization film is formed to bury steps of the shield layer, and the pixel electrode is disposed on the planarized surface of the second planarization film. Since the transmission type display has the structure in which the conductive shield layer is put between the upper second planarization film and the lower first planarization film each of which is made from an insulating material, the shielding performance and the alignment characteristic of the display can be improved.

10 Claims, 13 Drawing Sheets

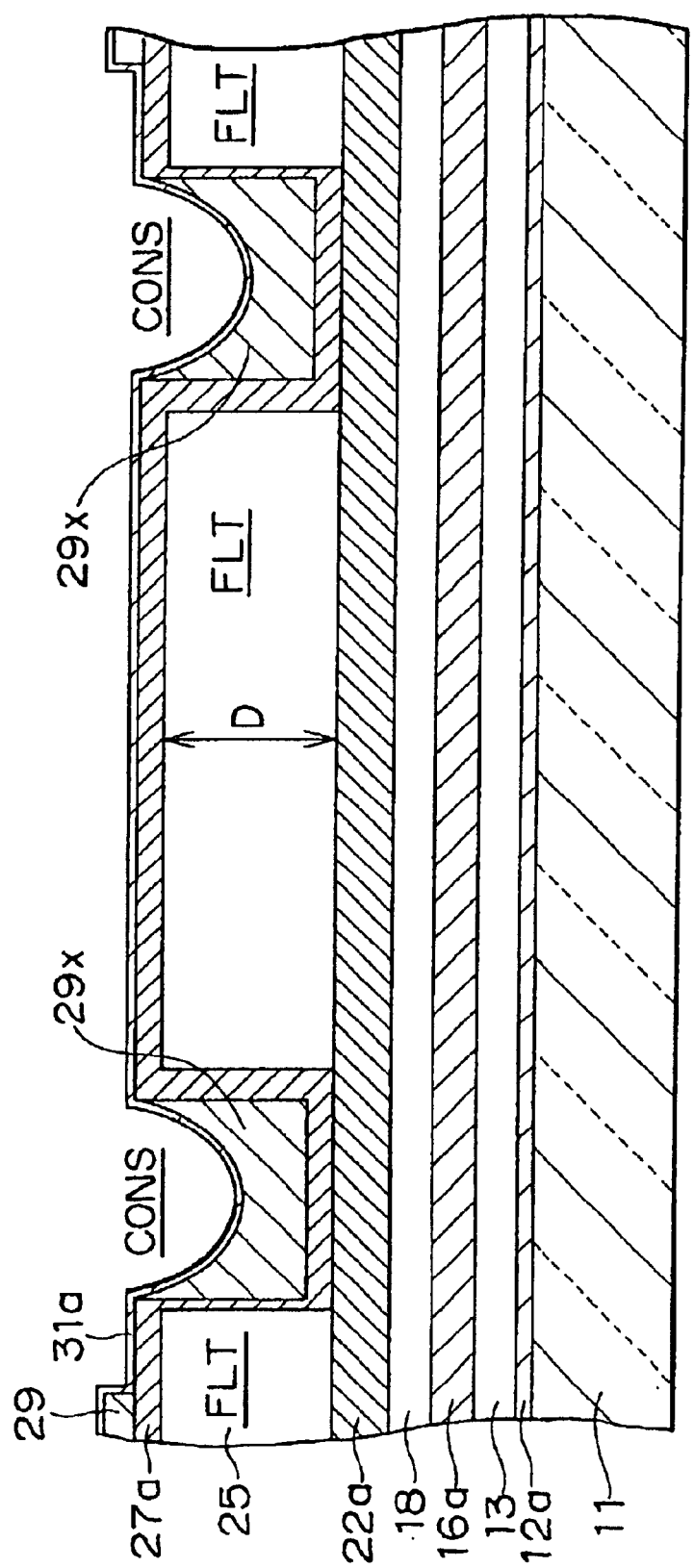

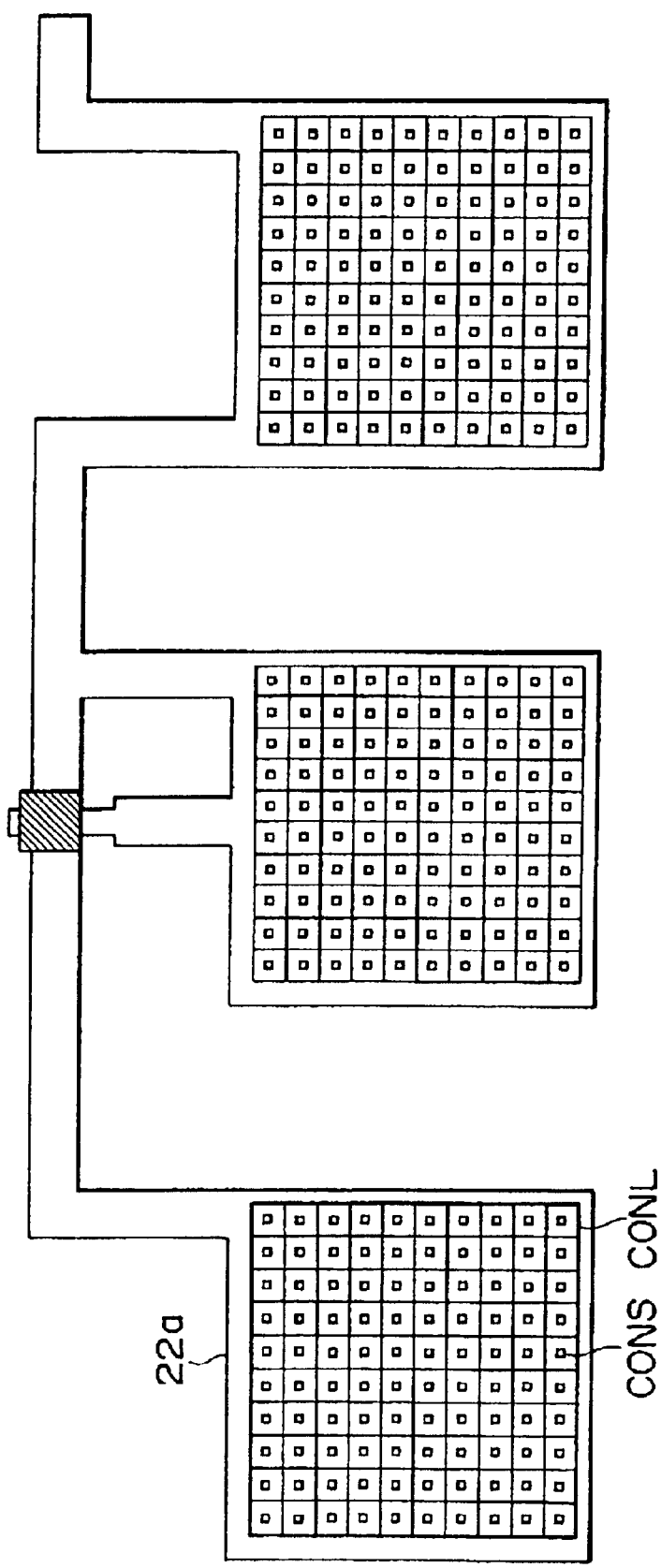

DISPLAY AND FABRICATING METHOD THEREOF

This application is a divisional application of Ser. No. 09/698,087 filed Oct. 30, 2000 now U.S. Pat. No. 6,501,096 B1.

BACKGROUND OF THE INVENTION

The present invention relates to a display and a fabrication method thereof. In particular, the present invention is suitably applied to a liquid crystal display of a type in which a conductive shield film is provided at a position over a thin film transistor for driving a pixel electrode and under the pixel electrode.

Liquid crystal displays have been extensively used as flat displays. As thin film transistors (TFTs) for driving pixel electrodes provided in these liquid crystal displays, amorphous silicon (a-Si) TFTs have been conventionally used; however, recently, polycrystalline Si TFTs have come to be frequently used. The optical sensitivity of a polycrystalline Si TFT is not higher than that of an a-Si TFT; however, since recent liquid crystal-displays, for example, projectors have been increasingly used under a large light quantity, even a polycrystalline Si TFT causes a non-negligible amount of light leakage current. The light leakage current leads to degradation of an image quality, such as reduction in contrast, crosstalk, or flicker.

To suppress the occurrence of a light leakage current from a thin film transistor of a liquid crystal display, there has been adopted a configuration in which the thin film transistor is covered with a shield film made from a metal. In general, the shield film is formed on the thin film transistor via an underlying insulating film, and a pixel electrode is formed on the metal made shield film via another insulating film. However, since the surface of the thin film transistor has irregularities, the shield film is affected by the irregularities of the thin film transistor via the insulating film. In particular, portions of the shield film, positioned at slopes of the irregularities of the thin film transistor, become thinner. The shielding performance of these thinner portions of the shield film becomes poor. Further, steps of the shield film, which are formed by the irregularities of the thin film transistor, also exert adverse effect on the surface of the insulating film on which the pixel electrode is to be formed. The surface of the insulating film on which the pixel electrode is formed is in contact with a liquid crystal, and in general, an alignment film is formed on the insulating film to cover the pixel electrode. As a result, if steps occurs on the surface of the insulating film by the effect of the steps of the shield film, it is difficult to uniformly treat an alignment film, which is formed on-the insulating film to cover the pixel electrode, over the entire surface of the substrate.

SUMMARY OF THE INVENTION

An object of the present invention is to provide a display capable of improving both the shielding performance and the alignment characteristic, and a method of fabricating the display.

To achieve the above object, according to the present invention, there is provided a display in which a thin film transistor for driving a pixel electrode is provided on a substrate and a conductive shield layer is provided at a position over the thin film transistor and under the pixel electrode, the display including: a first planarization film formed to bury an irregular contour of the thin film transistor, the shield layer being disposed on the planarized surface of the first planarization film; and a second planarization film formed to bury steps of the shield layer, the pixel electrode being disposed on the planarized surface of the second planarization film. The first planarization film may be obtained by forming an insulating film, and planarizing the surface of the insulating film by chemical-mechanical polishing. The first planarization film may be obtained by smoothly applying an insulating material by spin-coating, and baking the insulating material. The second planarization film may be obtained by forming an insulating film, and planarizing the surface of the insulating film by chemical-mechanical polishing. The second planarization film may be obtained by smoothly applying an insulating material by spin-coating, and baking the insulating material. The second planarization film may be obtained by applying an organic resin.

The above-described display, preferably, further includes a terminal region for electrical connection, in which a contact-hole portion opened in the first planarization film and a flat surface portion surrounding the contact-hole portion are provided; wherein a metal conductive layer constituting the shield layer is connected to an underlying interconnection via the contact-hole portion; and a transparent conductive layer constituting the pixel electrode is in contact with the metal conductive layer on the flat surface portion from which the second planarization film is removed. An opening area of the contact-hole portion may be in a range of 100 $\mu m^2$ or less. The contact-hole portion may be configured as a plurality of contact-hole portions which are formed in the terminal region in such a manner as to be separated from each other by means of the flat surface portion. The second planarization film may be removed from the flat surface portion, and at least part of the second planarization film may remain in the contact-hole portion. The display, preferably, further includes a counter substrate on which a counter electrode is formed; wherein the counter substrate is joined to the substrate on which the pixel electrode has been formed with a specific gap put therebetween; and a liquid crystal is held in the gap.

According to the present invention, since the conductive shield layer is formed on the first planarization film covering the thin film transistor, the step coverage of the shield layer is enhanced and the uniformity of the thickness of the shield layer is improved. As a result, the shield layer exhibits a sufficient shielding performance, to thereby significantly reduce leakage light. This makes it possible to suppress occurrence of light leakage current even under light irradiation of a high brightness. Also, according to the present invention, steps of the shield layer are buried by covering the surface of the shield layer with the second planarization film. The pixel electrode is formed on the planarized surface of the second planarization film, and an alignment layer is formed to cover the pixel electrode and is subjected to a liquid crystal alignment treatment. Since the surface of alignment layer being in contact with the liquid crystal is smoothened, it can be uniformly subjected to the alignment treatment. In this way, by adopting the structure in which the conductive shield layer is put between the upper and lower planarization films each of which is made from an insulating material, it is possible to improve the shielding performance and the alignment characteristic of a transmission type liquid crystal display.

BRIEF DESCRIPTION OF THE DRAWINGS

FIG. 15 is a schematic partial sectional view showing an embodiment of a terminal region formed in the display according to the present invention; and FIG. 16 is a plan view of the terminal region shown in FIG. 15.

DETAILED DESCRIPTION OF THE PREFERRED EMBODIMENTS

Figure 1:
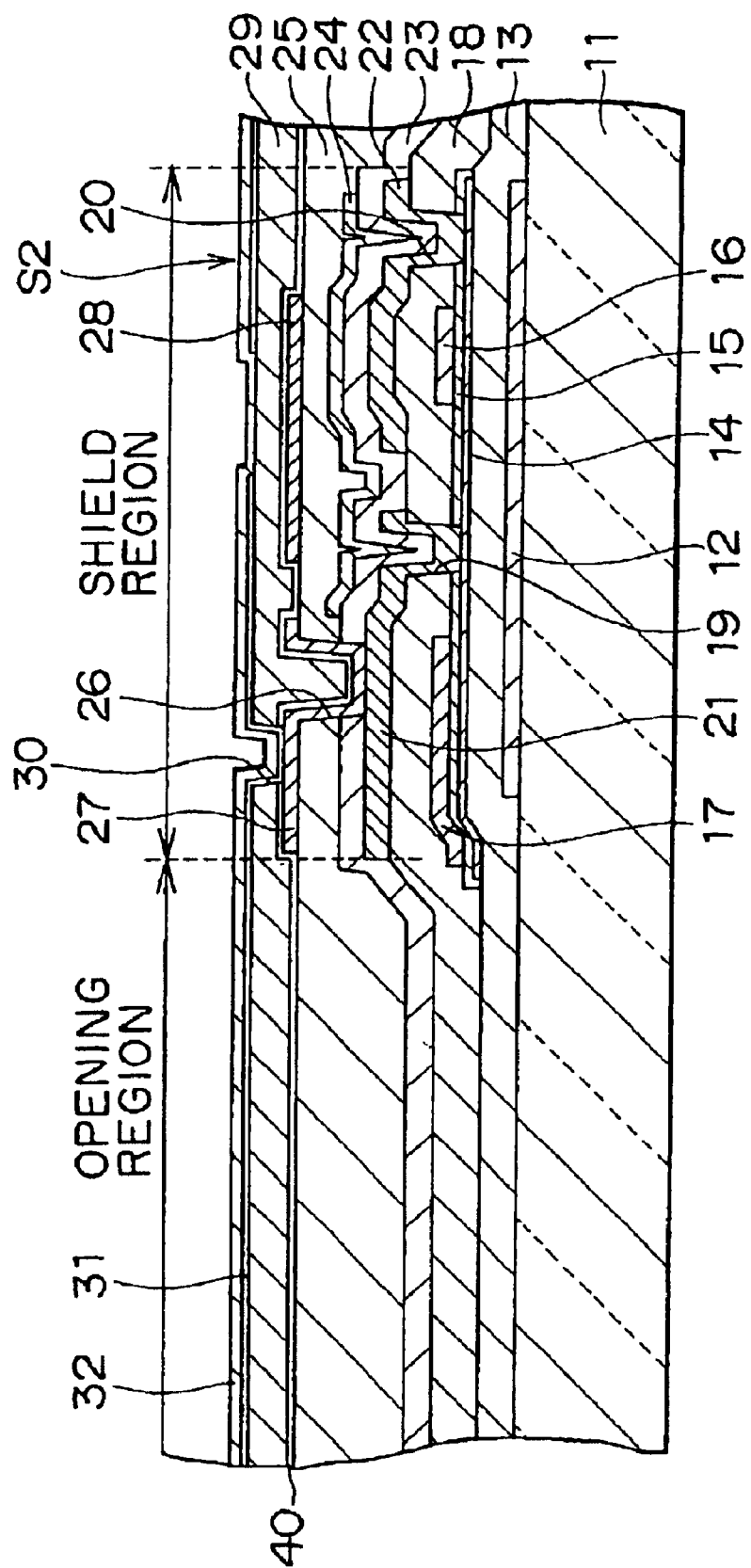
FIG. 1 is a sectional view showing a TFT substrate of a liquid crystal display according to an embodiment of the present invention.

Hereinafter, an embodiment of the present invention will be described with reference to the accompanying drawings. In the figures, parts being the same as or similar to each other are designated by the same reference numerals. FIG. 1 shows one example of a TFT substrate of an active-matrix type liquid crystal display according to this embodiment, and FIG. 2 shows one example of the entire configuration of the liquid crystal display.

Figure 2:
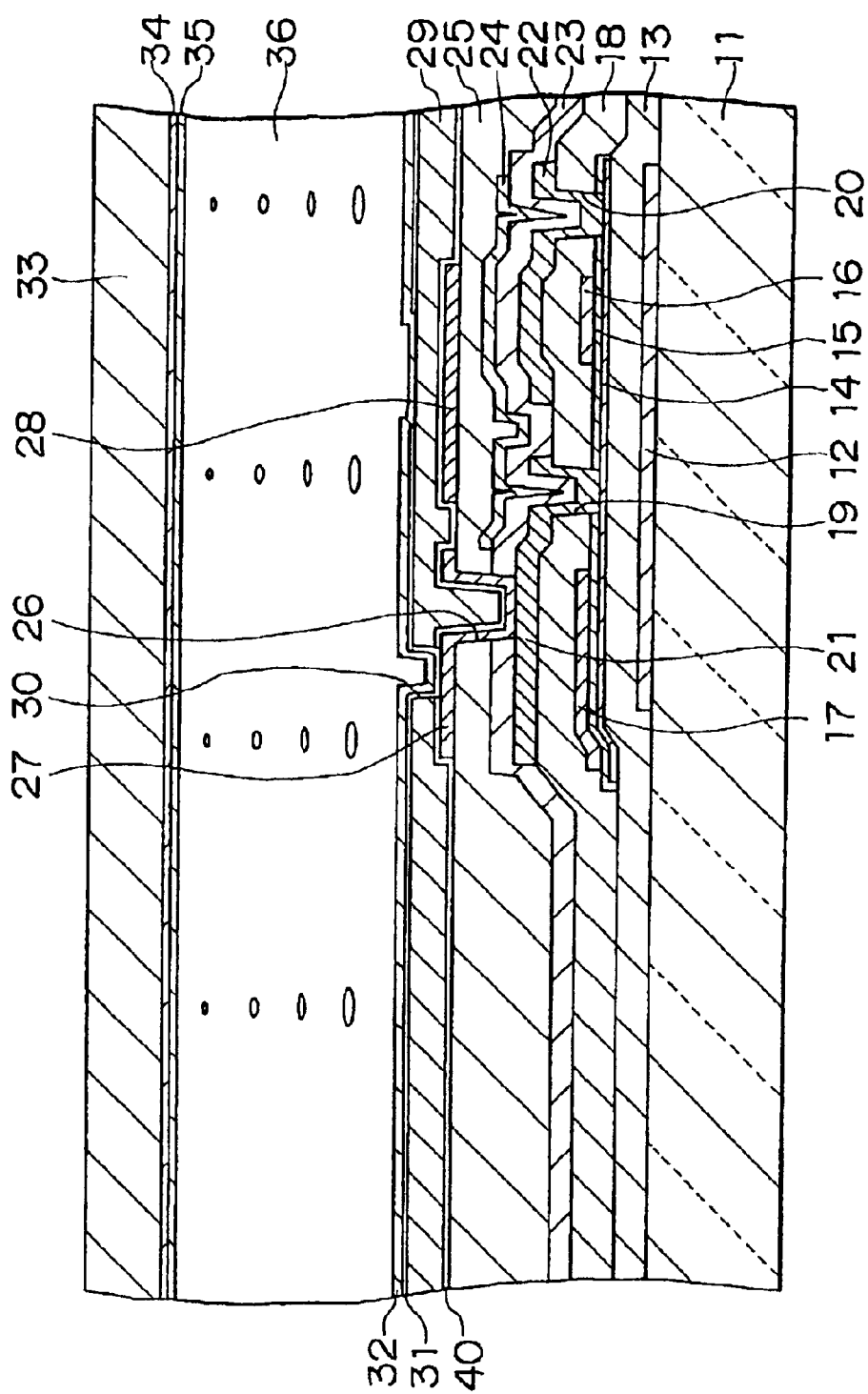
FIG. 2 is a sectional view showing the entire configuration of the liquid crystal display according to the embodiment of the present invention.

Referring to FIGS. 1 and 2, there is shown a liquid crystal display according to this embodiment, in which a shield layer 12 is provided on a portion, within a shield region, of a quartz glass substrate 11. The shield layer 12 is comprised of a stacked film formed by sequentially stacking a 50 nm thick polycrystalline Si film doped with phosphorus (P) and a 200 nm thick WSi film. An interlayer insulating film 13 made from $SiO_2$ is provided to cover the shield layer 12. A polycrystalline Si film 14 having a specific shape is provided on the interlayer insulating film 13, and a gate insulating film 15 made from $SiO_2$ is provided to cover the polycrystalline Si film 14. A gate interconnection 16 is provided on the gate insulating film 15. While not shown, a source region and a drain region are formed in the polycrystalline Si film 14 in self-alignment to the gate interconnection 16. A gate electrode composed of the gate interconnection 16 and the source and drain regions constitute a polycrystalline Si TFT for driving a pixel electrode. An electrode 17 is provided on the gate insulating film 15 at a position over the drain region.

The structure in which the gate insulating film 15 is put between the electrode 17 and the drain region forms a retention capacitance device.

The gate interconnection 16 and the electrode 17 are formed by a stacked film obtained by sequentially stacking a 100 nm thick polycrystalline Si film doped with P and a 100 nm thick WSi film. An interlayer insulating film 18 made from $SiO_2$, for example, is provided to cover the gate interconnection 16 and the electrode 17. Contact-holes 19 and 20 are formed in the interlayer insulating layer 18 and the gate insulating film 15 at specific positions. An extraction electrode 21 is provided on a portion, within the shield region, of the interlayer insulating layer 18 in such a manner as to be connected to the drain region of the polycrystalline Si TFT via the contact-hole 19. A signal interconnection 22 is formed on a portion, within the shield region, of the interlayer insulating film 18 in such a manner as to be connected to the source region of the polycrystalline Si TFT via the contact-hole 20. The extraction electrode 21 and the signal interconnection 22 are formed by a stacked film obtained by sequentially stacking a 50 nm thick WSi film, a 300 nm thick Al film, and a 50 nm thick WSi film. An interlayer insulating film 23 made from $SiO_2$ is provided to cover the extraction electrode 21 and the signal interconnection 22. The interlayer insulating film 23 is configured as a 400 nm thick PSG film formed by a normal pressure CVD process. A 200 nm thick SiN film 24 formed by a plasma CVD process is provided on the interlayer insulating film 23 at a specific portion. The SiN film 24 is taken as a hydrogen supply source for making inactive dangling bonds present in the polycrystalline Si film 14 thereby improving characteristics of the polycrystalline Si TFT. A first planarization film 25 is provided on the interlayer insulating film 23 and the SiN film 24. The first planarization film 25 is comprised of an $SiO_2$ film formed by the plasma CVD process using TEOS as a source gas. A contact-hole 26 is provided in the first planarization film 25 and the interlayer insulating film 23 at a specific portion over the extraction electrode 21. The surface of the first planarization film 25, except for the contact-hole 26 portion, is planarized at a residual step level of at least 0.5 $\mu$m or less, preferably, 0.3 $\mu$m or less. The thickness of the first planarization film 25 is 1.8±0.5 $\mu$m at the opening region portion and about 0.3 $\mu$m at the portion over the extraction electrode 21.

Conductive shield layers 27 and 28 are separately provided on the planarized surface of the first planarization film 25. The conductive shield layer 27 is connected to the extraction electrode 21 via the contact-hole 26. These conductive shield layers 27 and 28 are formed by a 250 nm thick Ti film. With the superimposition of the conductive shield layers 27 and 28 on the extraction electrode 21 and the signal interconnection 22, the entire region of the display except for the pixel opening region is shielded from incident light traveling from above. The conductive shield layer 27 is connected to the pixel electrode (to be described later) and the conductive shield layer 28 is connected to a specific common potential.

A second planarization film 29 is provided, via an intermediate film 40, to cover the conductive shield layers 27 and 28. The second planarization film 29 is comprised of a 400 nm thick $SiO_2$ film formed by a spin-coat process using a silanol compound as a raw liquid. A contact-hole 30 is provided in the second planarization film 29 at a specific portion over the conductive shield layer 27. A transparent pixel electrode 31 is provided on the second planarization film 29 in such a manner as to be connected to the conductive shield layer 27 via the contact-hole 30. The pixel electrode 31 is comprised of a 70 nm thick ITO film. A liquid crystal alignment film 32 made from polyimide, for example, is provided to cover the pixel electrode 31.

As shown in FIG. 2, a counter substrate is prepared by sequentially stacking a transparent electrode 34 as a counter electrode and a liquid crystal alignment film 35 on one principal plane of a glass substrate 33, and the TFT substrate configured as described above is jointed to the counter substrate with a gap put therebetween. A liquid crystal 36 is enclosed in the gap between both the substrates 11 and 33. In some cases, fine spacers are interposed between both the substrates 11 and 33 for keeping the gap at a specific value.

Figure 3:
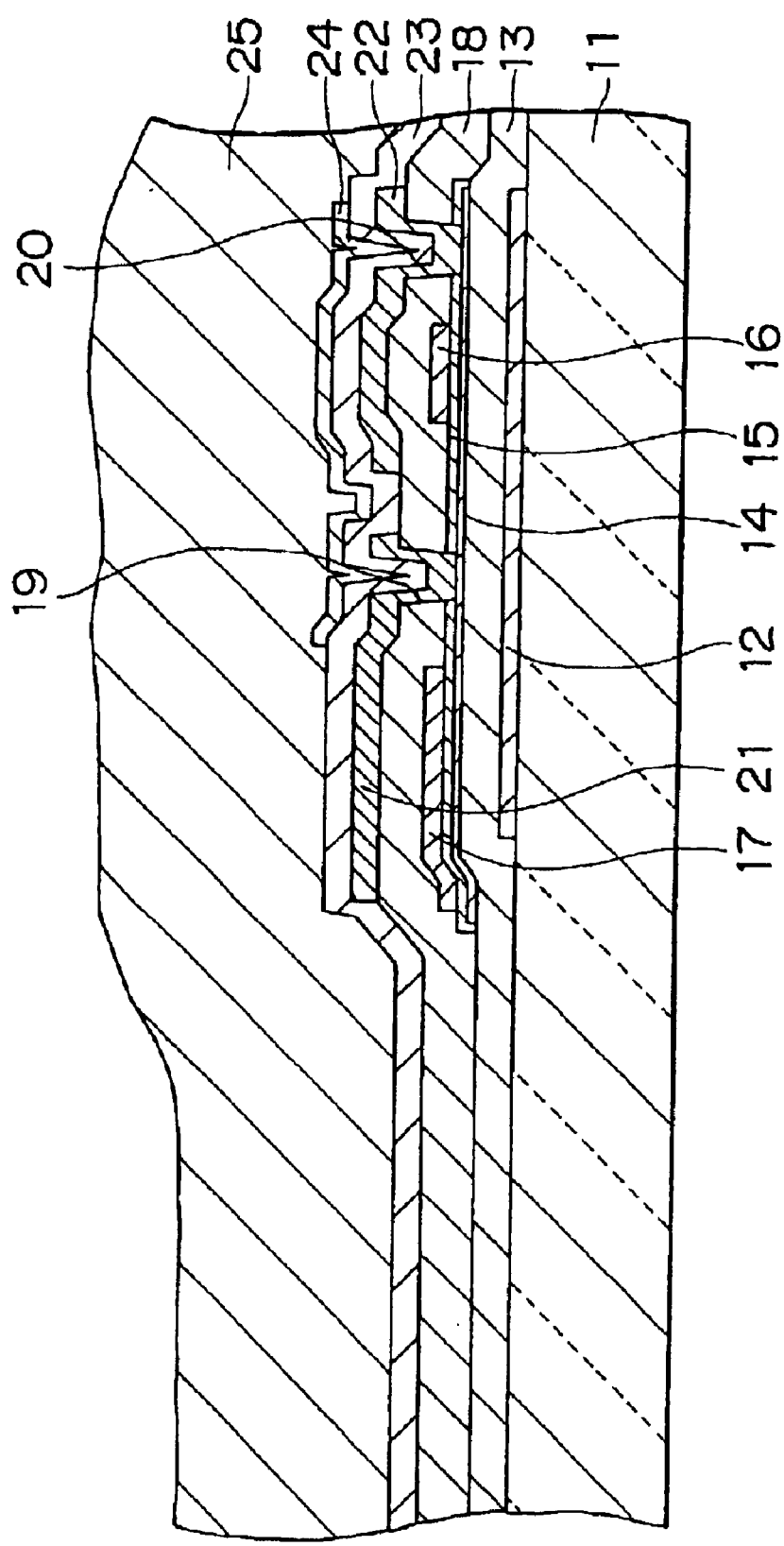
FIGS. 3 and 4 are sectional views illustrating a method of fabricating a liquid crystal display according to an embodiment of the present invention.

A method of producing the liquid crystal display according to this embodiment, which has the above-described configuration, will be described below. First, as shown in FIG. 3, a polycrystalline Si film doped with P and a WSi film are sequentially formed on a quartz glass substrate 11, followed by patterning of these films, to form a shield layer 12. An interlayer insulating film 13 made from $SiO_2$ is formed overall on the substrate by a CVD process. A polycrystalline Si film 14 is formed overall on the substrate by the CVD process and is then patterned into a specific shape. A gate insulating film 15 made from $SiO_2$ is formed overall on the substrate by the CVD process and is then patterned into a specific shape. A polycrystalline Si film doped with P and a WSi film are sequentially formed overall on the substrate, followed by patterning, to form a gate interconnection 16 and an electrode 17 for a capacitance device.

An interlayer insulating film 13 made from $SiO_2$ is formed overall on the substrate by the CVD process. Specific portions of the interlayer insulating film 18 and the gate insulating film 15 are removed by etching, to form contact-holes 19 and 20. A WSi film, an Al film, and WSi film are sequentially formed overall on the substrate, followed by patterning, to form an extraction electrode 21 and a signal interconnection 22. An interlayer insulating film 23 made from $SiO_2$ is formed overall on the substrate by a normal CVD process. An SiN film 24 is formed overall on the substrate by a plasma CVD process and is then patterned into a specific shape.

Next, a first planarization film 25 made from $SiO_2$ is formed overall on the substrate by the plasma CVD process using TEOS as a source gas. The thickness of the first planarization film 25 is set at 2500 nm.

Figure 4:
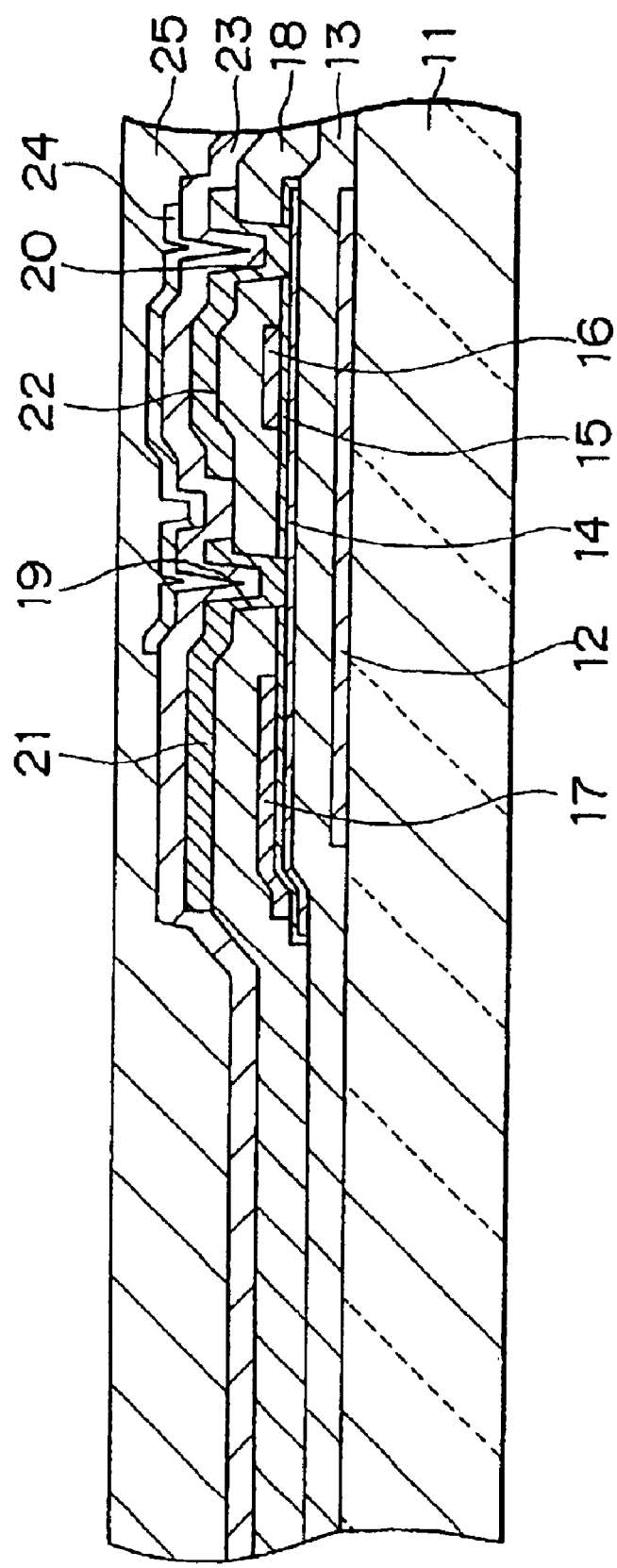

As shown in FIG. 4, the first planarization film 25 is planarized by a CMP process. To be more specific, the surface portion of the first planarization film 25 is chemically, mechanically polished by a thickness of about 2200 nm. By planarization of the film 25 by the CMP process, the residual step level of the film 25 can be reduced to at least 0.5 μm or less, and further, reduced to 0.1 μm or less depending on the CMP condition. One example of the CMP condition is as follows:

Polishing Load: 4709 f/cm²
Rotational Speed of Chuck: 60 rpm
Rotational Speed of Table: 4 rpm
Height of Retainer: 840 μm
Polishing Rate: 4 min at 500 nm/min
Dressing Type: in-situ dressing
Slurry: SS-25 (slurry formed by dispersing silica particles in KOH solution) diluted with ½ pure water As shown in FIG. 1, specific portions of the first planarization film 25 and the interlayer insulating film 23 are removed by etching, to form a contact-hole 26. A Ti film is formed overall on the substrate by a vacuum vapor-deposition process or sputtering process, followed by patterning of the film, to form conductive shield layers 27 and 28. In the formation of the Ti film, since the surface of the underlying first planarization film 25 is previously planarized, the step coverage of the Ti film, that is, the conductive shield layers 27 and 28 is desirable, with a result that the thickness of the Ti film, that is, the conductive shield layers 27 and 28 is uniform.

Figure 5A:
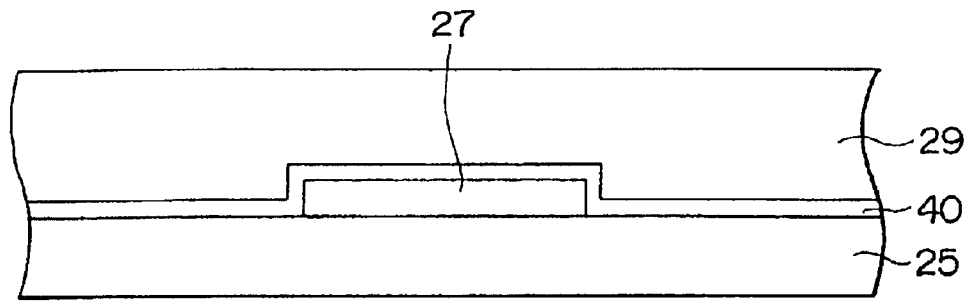
FIGS. 5A to 5C are schematic views illustrating the method of fabricating a liquid crystal display according to the embodiment of the present invention.
Figure 5B:
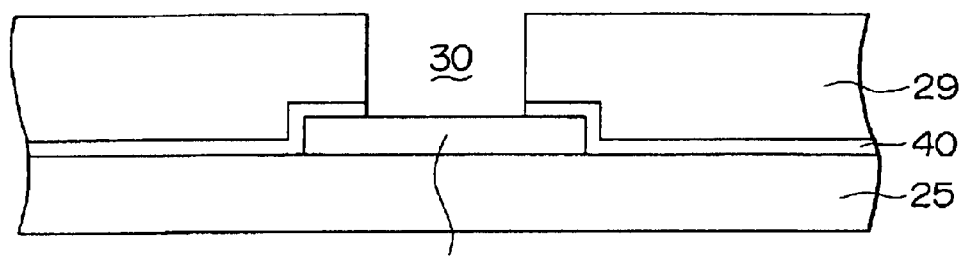
Figure 5C:
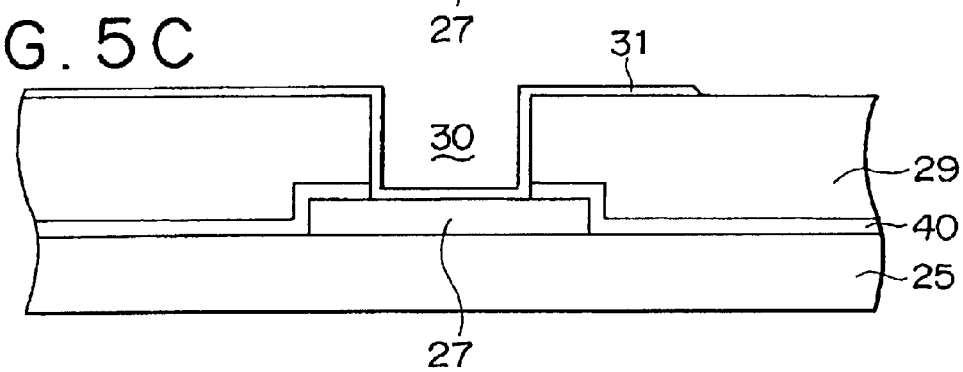

A second planarization film 29 is formed on the shield layers 27 and 28 via an intermediate film 40. In this embodiment, the second planarization film 29 is formed by an SOG process. FIGS. 5A to 5C schematically show the formation of the second planarization film 29 by using the SOG process. Referring to FIG. 5A, at the preliminary step, the intermediate film 40 made from P-TEOS is formed to cover the shield layers 27 and 28 (only the shield layer 27 is shown in FIG. 5) formed on the first planarization film 25. The thickness of the intermediate film 40 is about 100 nm. In addition, the thickness of the shield layer 27 is about 275 nm. The second planarization film 29 is formed on the intermediate film 40 by the SOG process. The intermediate film 40 is effective for surface preparation to prevent peeling of the second planarization film 29. The SOG process uses a solution in which a silanol compound $(RnSi(OH)_4n)$ is dissolved in a solvent such as methanol. The silanol compound solution is applied to a thickness of 400 nm by spin-coating. By the spin-coating, the surface of the coated film becomes sufficiently smooth. The coated film is sequentially baked for about 60 sec at each of 80° C., 150° C., and 200° C., to evaporate the solvent such as methanol, and then annealed in a nitrogen atmosphere at 400° C. for 30 min, to vitrify the silanol compound by condensation due to dehydration. At the annealing step, R-groups contained in the silanol compound are also dissipated.

Referring to FIG. 5B, a specific portion of the second planarization film 29 is removed by etching, to form a contact-hole 30. Referring to FIG. 5C, an ITO film is formed overall on the substrate to a thickness of 70 nm, followed by patterning of the ITO film by etching, to form a pixel electrode 31. While not shown, an alignment film is formed overall on the substrate. In this way, a TFT substrate is produced. The TFT substrate is then subjected to the known steps, to accomplish the liquid crystal display shown in FIG. 2.

Figure 6:
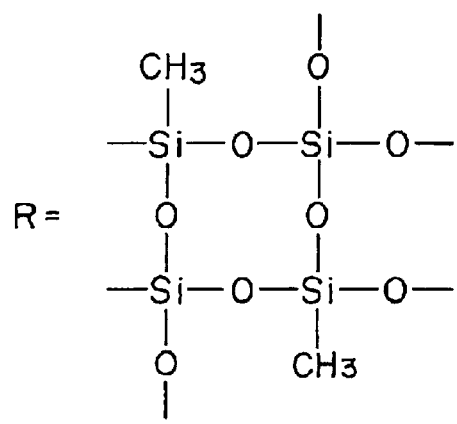
FIG. 6 is a diagram showing one example of a chemical structural formula of a silanol compound.

FIG. 6 shows a chemical structural formula of one example (particularly, one example of the R group portion) of the silanol compound $(RnSi(OH)_4n)$ used for the SOG process shown in FIG. 5. Specific example of this silanol compound may include a silanol compound sold by Tokyo Ohka Kogyo Co., Ltd. under the trade name of OCD Type-7.

This embodiment configured as described above has the following advantage: namely, since the conductive shield layers 27 and 28 are formed on the surface, planarized by the CMP process, of the first planarization film 25, the step coverage of the conductive shield layers 27 and 28 becomes desirable and the thickness thereof becomes uniform, as compared with the related art display and its production method, so that the shielding performance of the conductive shield layers 27 and 28 is enhanced, to suppress leakage of light, thereby significantly reducing a light leakage current. As a result, even if the display is operated in a large light quantity state, it is possible to significantly reduce both a luminescent spot failure and a crosstalk due to the light leakage current, and hence to suppress the degradation of an image quantity. Another advantage of this embodiment is that since the pixel electrode is formed on the planarized surface of the second planarization film 29 formed by the SOG process, it is possible to uniformly treat the alignment film 32 formed to cover the pixel electrode 31. To be more specific, the steps of the shield layers 27 and 28 formed on the first planarization film 25 are buried with the second planarization film 29 and then the pixel electrode 31 and the alignment film 32 are sequentially formed on the second planarization film 29. As a result, since the alignment film 32 is formed to cover the pixel electrode 31 formed on the planarized surface of the second planarization film 29, it is possible to uniformly treat the alignment film 32 by typically rubbing over the entire surface of the substrate. Accordingly, it is possible to suppress occurrence of a liquid crystal alignment failure such as disclination and hence to suppress degradation of an image quality.

In this embodiment, the first planarization film is formed by the CMP process, to bury the irregular contour of the thin film transistor. As described above, the CMP process involves forming an insulating film, and chemically, mechanically polishing the surface of the insulating film, to thereby planarize the surface of the insulating film. According to the present invention, however, the formation of the first planarization film is not necessarily performed by the CMP process but may be performed by the SOG process. Further, in this embodiment, the second planarization film is formed by the SOG process, to bury the steps of the shield layers. The SOG process involves smoothly applying an insulating material by spin-coating and baking the insulating film, to thereby form a planarization film. According to the present invention, however, the formation of the second planarization film is not necessarily performed by the SOG process, but may be performed by the CMP process or by a process of applying a transparent organic resin such as acrylic resin and hardening the resin film. In general, planarization films can be performed by various processes, specific examples of which may include a process capable of forming a film having a good burying performance such as a plasma CVD or normal pressure CVD process using tetraethoxysilane (TEOS); a process of forming a phosphosilicate glass (PSG) film or a borophosphosilicate glass (BPSG) film, followed by reflow thereof; a fluxion process using spin-on-glass (SOG); a process of forming an insulating film, followed by etching-back thereof; and a process of forming an insulating film, and polishing the surface thereof by the chemical-mechanical polishing (CMP) process.

Figure 7:
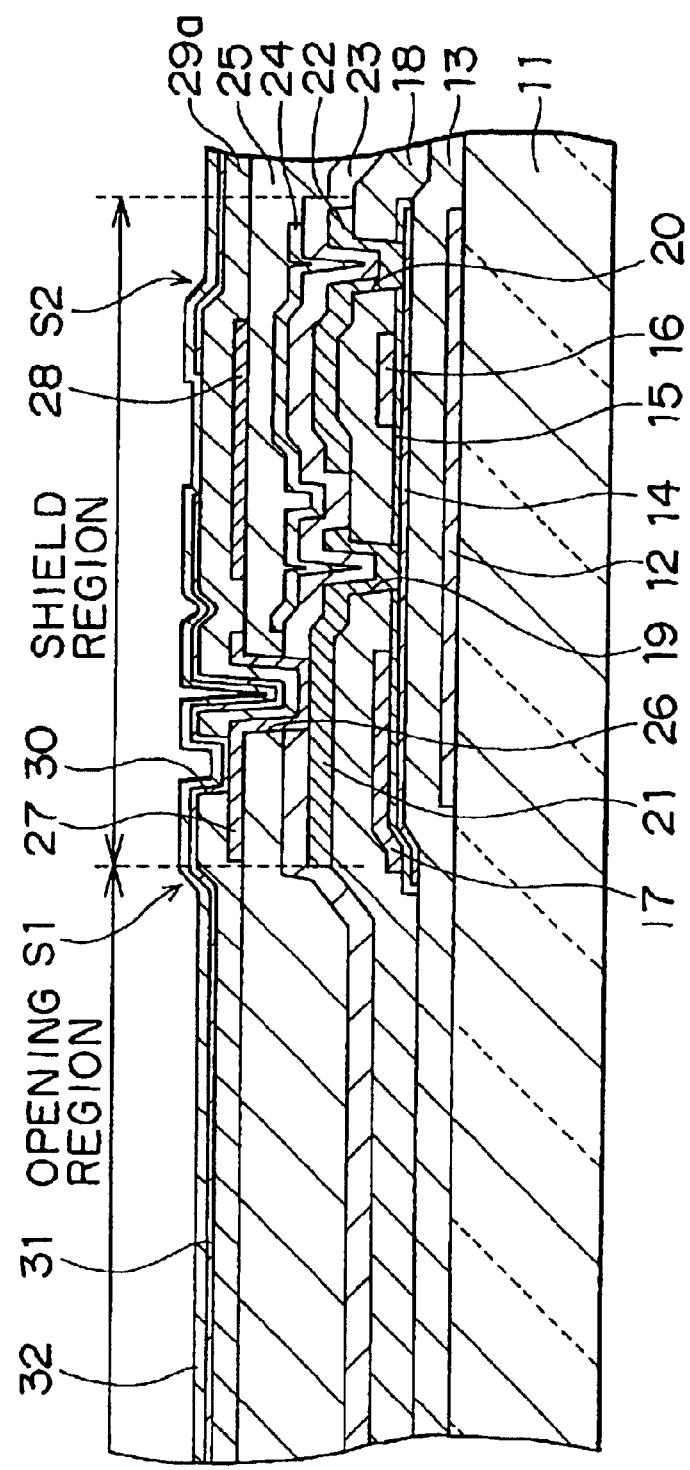
FIG. 7 is a sectional view showing a reference example of a liquid crystal display.

FIG. 7 shows a reference example of a liquid crystal display. For an easy understanding, parts corresponding to those in the embodiment of the present invention shown in FIG. 1 are designated by the same reference numerals. This reference example is different from the embodiment shown in FIG. 1 in that a usual interlayer insulating film 29a is used in place of the second planarization film 29. The interlayer insulating film 29a is formed by depositing a $SiO_2$ film to a thickness of 400 nm by the plasma CVD process using TEOS as a source gas. The interlayer insulating film 29a cannot sufficiently bury steps of conductive shield films 27 and 28, with a result that slopes occur on an alignment film 32. The regions in which slopes occur are designated by characters S1 and S2 in FIG. 7. It is impossible to uniformly treat the surface, on which the slopes occur, of the alignment film 32, with typical rubbing. That is to say, by the presence of the slopes on the alignment film 32, a liquid crystal alignment margin becomes smaller, and in this case, to achieve stable production, it is needed to strictly control the alignment layer treatment apparatus. For example, the exchange frequency of a buff material used for the rubbing apparatus becomes significantly higher, to thereby reduce the productivity. By the way, as the image quality level required in the market becomes significantly higher, it is required to equalize the so-called liquid crystal gap. To meet the requirement, the technique called OCS (On-Chip-Spacer) of forming fine spacers made from a material such as a resist on a TFT substrate has been partially adopted. However, if the spacers are formed by the OCS technique in the structure with a small alignment margin shown in FIG. 7, there frequently occur liquid crystal alignment failures called disclination.

From this viewpoint, according to the present invention, the second planarization film 29 is formed in addition to the first planarization film 25. To be more specific, by burying the steps of the shield layers 27 and 28 formed on the first planarization film 25 with the second planarization film 29 in order to planarize or smoothen the surfaces of the shield layers 27 and 28, it is possible to easily treat the alignment film 32 formed to cover the pixel electrode 31 formed on the planarized surface of the second planarization film 29 and to desirably form fine spacers by the OCS technique. As described above, the second planarization film 29 can be formed by the SOG technique, which technique may be replaced with the CMP technique or the planarization technique using an organic resin. In the case of forming the second planarization film 29 by using an organic material such as acrylic resin, a solution of the organic resin may be applied by spin-coating like the SOG technique.

Figure 8:
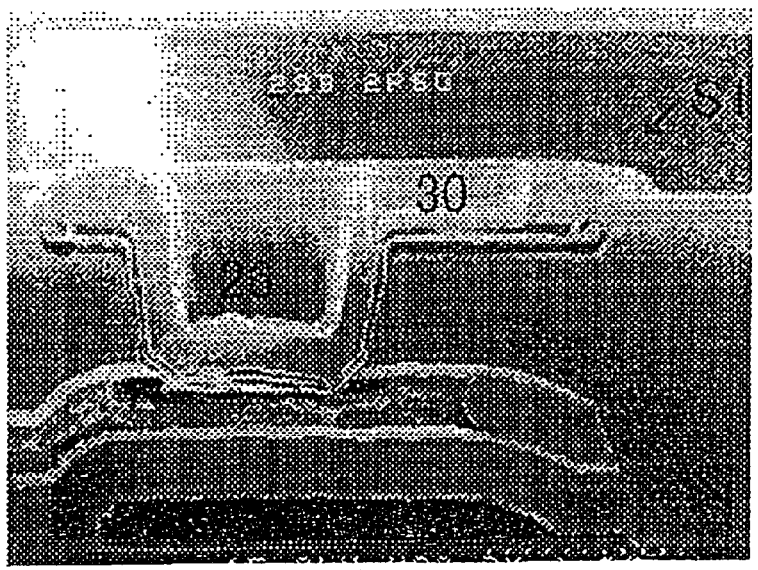
FIG. 8 is a microscopic photograph showing a sectional shape of the reference example shown in FIG. 7.

FIG. 8 is a microscopic photograph showing a sectional shape of the reference example shown in FIG. 7, particularly, the region S1 and its neighborhood, for example, the contact-holes 26 and 30. As is apparent from the microscopic photograph, a sloping step occurs in the region S1, which obstructs the rubbing treatment from being uniformly performed.

Figure 9:
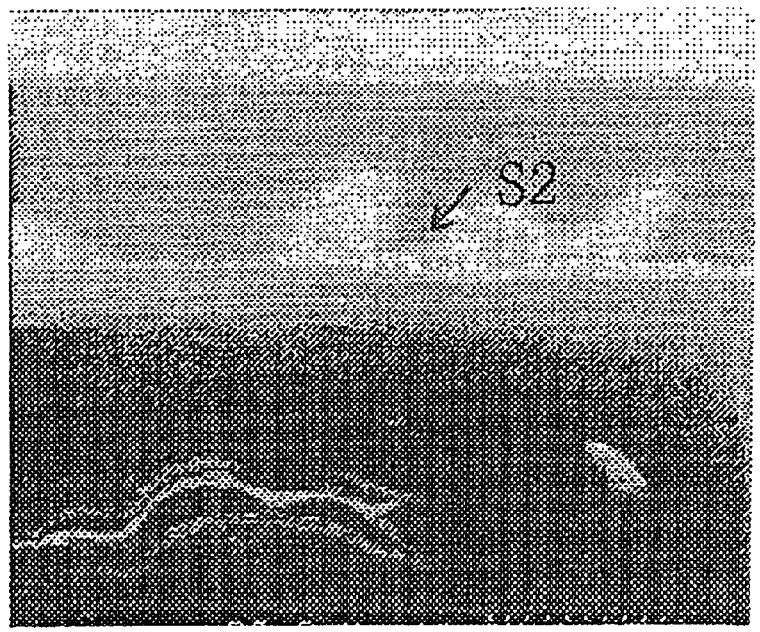
FIG. 9 is a microscopic photograph showing a sectional shape of the liquid crystal display according to the present invention.

FIG. 9 is a microscopic photograph showing a sectional shape of the display produced according to the present invention shown in FIG. 1, particularly showing the region S2 on a large scale. As is apparent from FIG. 9, there occurs no significant step. Accordingly, it is possible to uniformly treat the alignment film of this display with rubbing.

Figure 10:
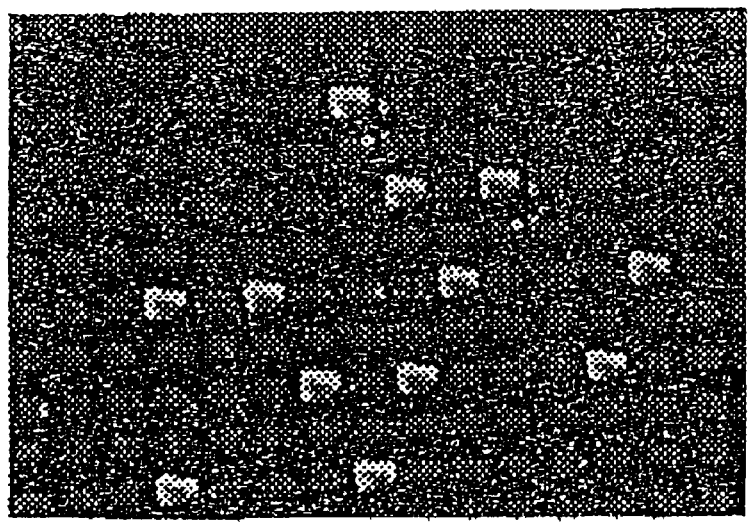
FIG. 10 is a microscopic photograph showing a surface state of the reference example shown in FIG. 8.

FIG. 10 is a microscopic photograph showing the surface state of the reference example shown in FIG. 8, in which the pixel electrodes, each being formed into approximately rectangular shape, are arranged into a matrix pattern. The OCS structure is shown in which one fine spacer is located at the intersection of two lines each connecting two of the four pixel electrodes arranged in a cruciform. With this reference example, since it is impossible to uniformly treat the alignment film, there occurs disclination (point defects).

Figure 11:
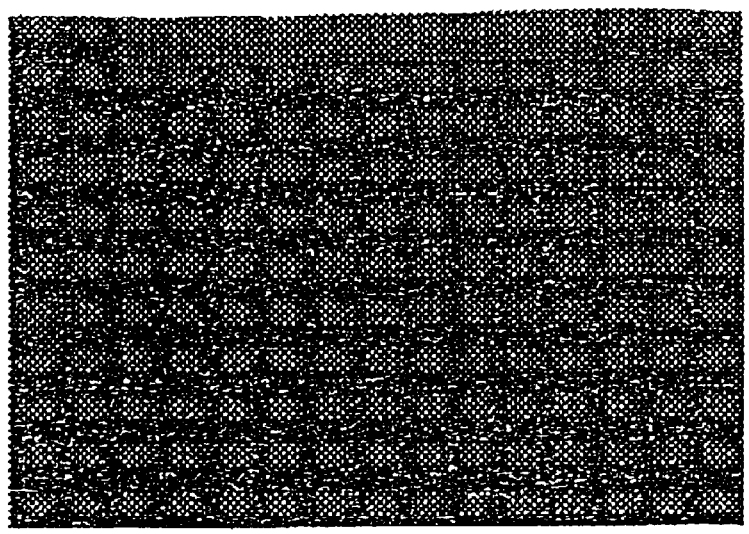
FIG. 11 is a microscopic photograph showing a surface state of the liquid crystal display according to the present invention shown in FIG. 9.

FIG. 11 is a microscopic photograph showing the surface state of the display shown in FIG. 1. This display adopts the OCS structure like the reference example shown in FIG. 10; however, in this display, there occurs no disclination. The reason for this is that the second planarization film has an effect of allowing the alignment film to be uniformly rubbed, thereby suppressing the occurrence of disclination.

Figure 12:
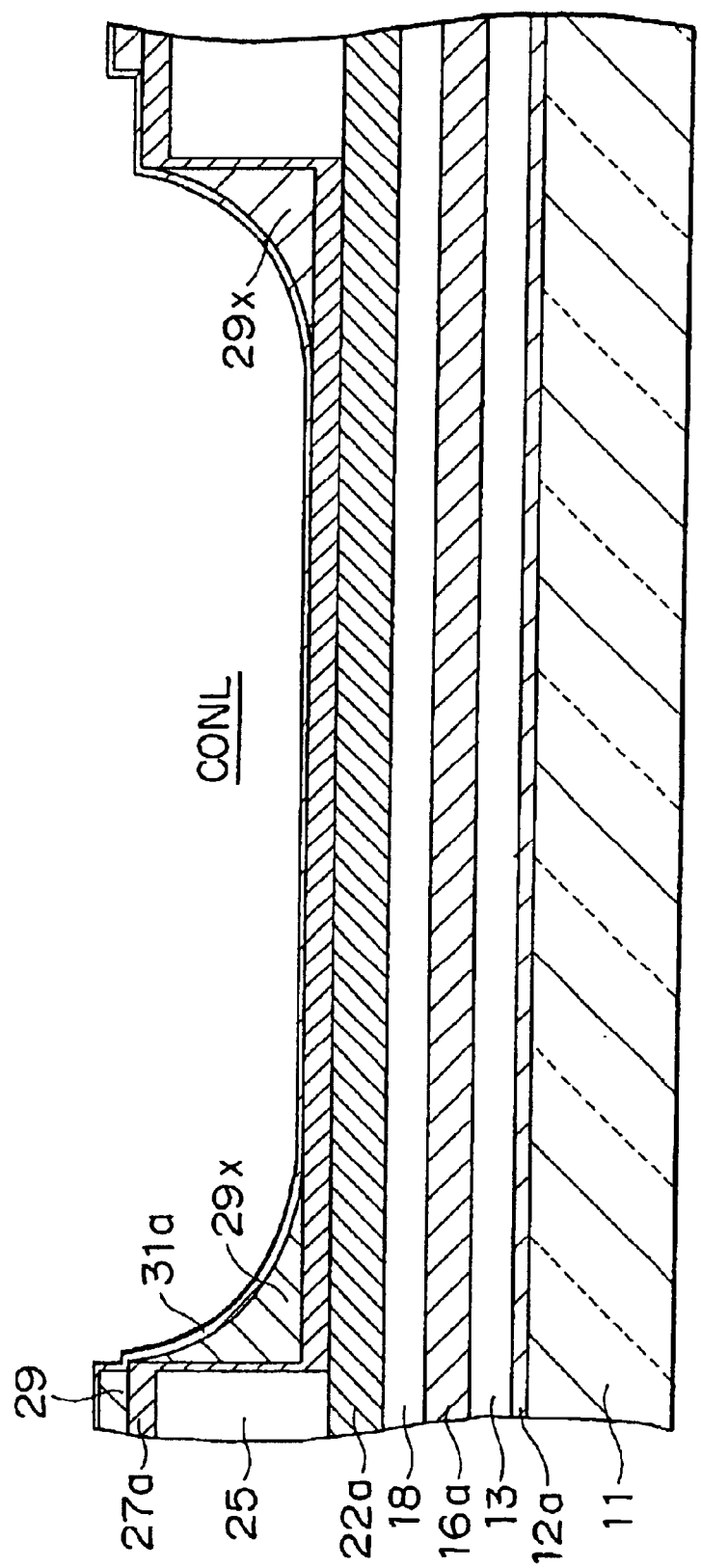
FIG. 12 is a reference diagram showing a terminal region formed at a peripheral portion of a liquid crystal display.

By the way, a terminal region such as a pad for electrical connection with an external is formed at a peripheral portion of a substrate of an active-matrix type liquid crystal display. FIG. 12 is a schematic sectional view showing a reference example of such a terminal region. As shown in FIG. 12, a contact-hole portion CONL having a large opening area of, typically, 10,000 $\mu m^2$ or more is formed in the terminal region. A layer structure similar to the layer structure shown in FIG. 1 is formed on a glass substrate 11 in the terminal region. To be more specific, a shield layer 12a being the same layer as the shield layer 12, the interlayer insulating film 13, an interconnection 16a being the same layer as the gate interconnection 16, the interlayer insulating film 18, an interconnection 22a being the same layer as the signal interconnection 22, a metal conductive film 27a being the same layer as the shield layer 27, and a transparent conductive film 31a being the same layer as the pixel electrode 31 are sequentially stacked on the substrate 11. The contact-hole portion CONL is opened in the first planarization film 25. The metal conductive film 27a is electrically connected to the interconnection 22a exposed from the contact-hole portion CONL. The second planarization film 29 is removed from the contact-hole portion CONL, and the transparent conductive film 31a is in contact with the metal conductive film 27a. A terminal of an external flexible substrate or an external probe pin comes into contact with the surface of the transparent conductive film 31a. In addition, as shown in FIG. 12, an insulating material 29x forming the second planarization film 29 partially remains in the contact-hole portion CONL. The second planarization film 29 is, as described above, formed by the SOG process. The SOG process is characterized by spin-coating a solution in which a silanol compound is dissolved by a solvent such as methanol, to realize the planarization (smoothening) of the surface of the film. Accordingly, the solution of a silanol compound tends to be accumulated at a deep portion of, for example, the large contact-hole portion CONL. For this reason, a thin film of the insulating material 29x is formed on the walls of the contact-hole portion CONL for forming the pad portion, usually having a large area of 10,000 $\mu m^2$ or more. As a result, an etching time for etching required to remove the insulating material 29x from the contact-hole portion CONL after formation of the second planarization film 29 becomes significantly longer. In the example shown in FIG. 12, as compared with the case without use of the second planarization film 29, the dry etching time becomes about 2.5 times, thereby largely degrading the productivity.

Figure 13:
FIG. 13 is a microscopic photograph showing the terminal region shown in FIG. 12.

FIG. 13 is a microscopic photograph showing a sectional shape, after formation of the second planarization film, of the terminal region shown in FIG. 12. As is apparent from this photograph, a large amount of the insulating material for forming the second planarization film flows in the large contact-hole portion CONL. The etching time for dry etching required to remove the insulating material becomes significantly longer.

Figure 14:
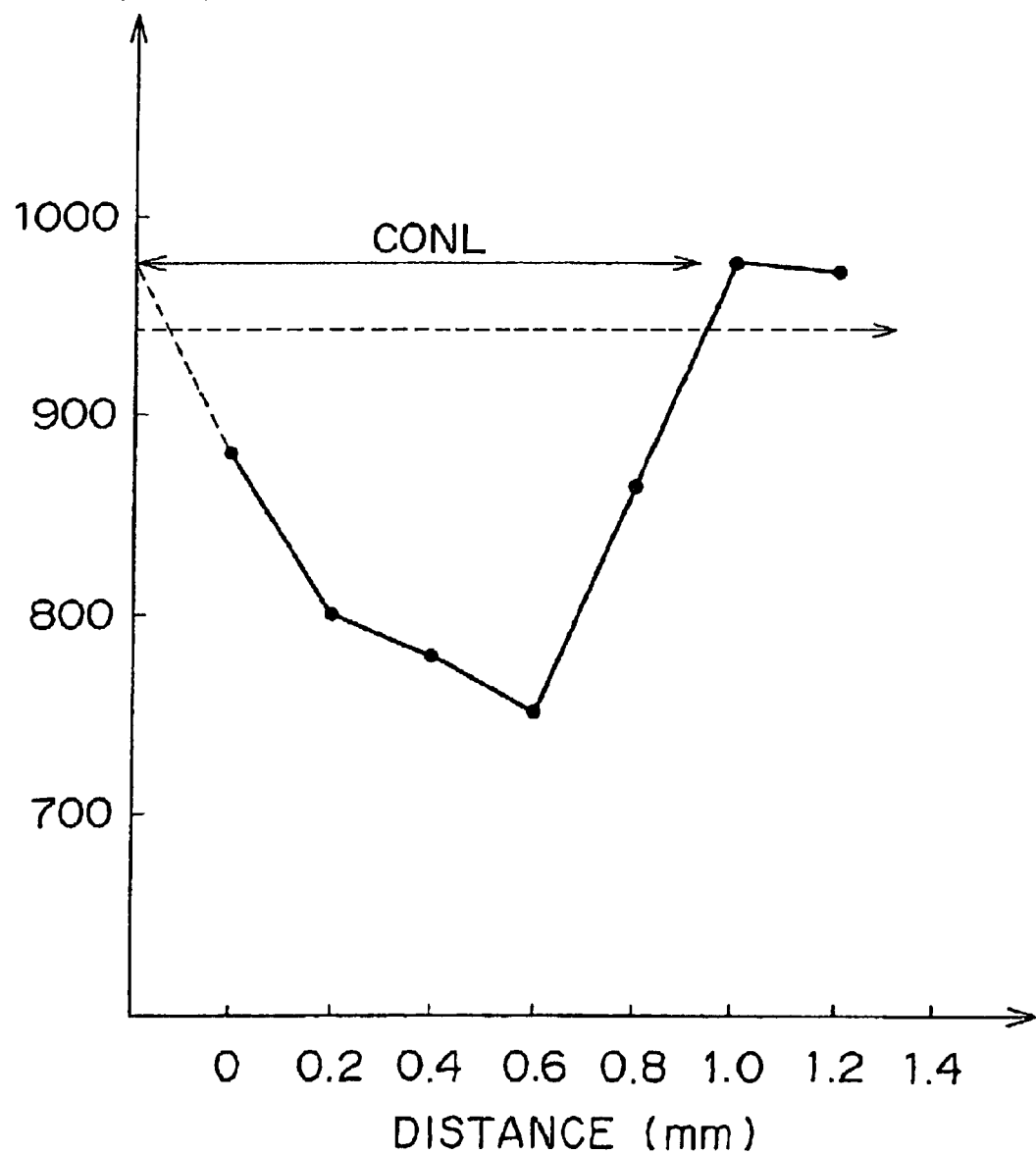
FIG. 14 is a graph showing a thickness distribution of a planarization film in the terminal region shown in FIG. 12.

FIG. 14 is a graph showing a result of measuring the thickness of the planarization film in the contact-hole portion CONL shown in FIG. 13. In this figure, the ordinate designates the thickness of the planarization film, and the abscissa designates the distance which is measured along the outward direction from a side wall, near the rotational center upon spin-coating, of the contact-hole portion. As is apparent from this graph, a large amount of the insulating material flows in the contact-hole portion CONL.

FIG. 15 shows a configuration in which the inconvenience of the terminal region shown in FIG. 12 is improved. For an easy understanding, parts corresponding to those shown in FIG. 12 are designated by the same reference numerals. As shown in the figure, contact-hole portions CONS opened in the first planarization film 25 and a flat surface portion FLT surrounding the contact-hole portions CONS are formed in a terminal region. The metal conductive film 27a for forming the shield layers is connected to the interconnection 22a exposed from the contact-hole portions CONS. The transparent conductive film 31a for forming the pixel electrode is in contact with the metal conductive film 27a on the flat surface portion FLT from which the second planarization film 29 is removed. The opening area of each of the contact-hole portions CONS is preferably limited to 100 $\mu m^2$ or less. A plurality of the fine contact-hole portions CONS separated from each other by means of the flat surface portion FLT are formed in the terminal region. The second planarization film 29 is removed from the flat surface portion FLT, and the insulating material 29x for forming the second planarization film 29 may remain in the contact-hole portions CONS.

A depth D of each of the contact-hole portions CONS is set in a range of 1.4 to 2.0 $\mu m$. In the reference example shown in FIG. 12, as described above, it takes a lot of time to perfectly remove, by dry etching, the insulating material 29x remaining in the contact-hole portion CONL having the depth D. On the contrary, in the embodiment shown in FIG. 15, since it is not required to perfectly remove the insulating material 29x from each of the contact-hole portions CONS, it is possible to shorten the dry etching time. Assuming that the dry etching time required in the reference example shown in FIG. 12 is taken as 2.5, the dry etching time required in the embodiment shown in FIG. 15 can be shortened to 1.25. To be more specific, in the embodiment shown in FIG. 15, since it is required to remove only part, remaining on the flat surface portion FLT, of the second planarization film 29, the etching time can be shortened. The transparent conductive film 31a is in contact with the metal conductive film 27a on the flat surface portion FLT, while the metal conductive film 27a is in contact with the interconnection 22a exposed from each of the contact-hole portions CONS. A external probe pin or flexible substrate comes into contact with the surface of the flat surface portion FLT in the terminal region. Since the contact resistance of the flat surface portion FLT is higher than the contact resistance in the contact-hole portions CONS, the ratio of the area of the flat surface portion FLT to the total area of the contact-hole portions CONS in the terminal region is preferably set at a large value.

FIG. 16 is a schematic plan view of an example of the terminal region shown in FIG. 15. In this figure, there are shown three of the terminal regions. A plurality of the contact-hole portions CONS each having the area of 100 $\mu m^2$ or less are disposed in each terminal region. For example, the contact-hole portions CONS, each having a size of 2 $\mu m \times 2$ $\mu m$ (4 $\mu m^2$), are disposed with a pitch of 10 $\mu m$ in a matrix pattern. With this arrangement, an external probe pin is brought into electrical contact with the interconnections 22a. For reference, the outer shape of the contact-hole portion CONL shown in FIG. 12 is additionally shown this figure.

As described above, according to the present invention, since the conductive shield layer is formed on the first planarization film, it is possible to improve the shielding performance of the conductive shield layer, and hence to suppress degradation of an image quality due to a light leakage current. Further, since the steps of the conductive shield layer are buried with the second planarization film and the pixel electrode and the alignment film are formed on the planarized surface of the second planarization film, it is possible to significantly improve the alignment state, and to increase the process margin of alignment treatment and hence to improve the productivity and significantly improve the display quality. In this way, by holding the conductive shield layer between the upper and lower planarization films, it is possible to improve the shielding performance and enhance the display quality. In particular, by using the second planarization film, even if fine spacers are formed on the TFT substrate, it is possible to eliminate the inconvenience that the alignment failures of a liquid crystal occur.

While the preferred embodiments of the present invention have been described using the specific terms, such description is for illustrative purposes only, and it is to be understood that changes and variations may be made without departing from the spirit or scope of the following claims.

What is claimed is:

1. A method of fabricating a display, including the steps of forming a thin film transistor for a driving a pixel electrode on a substrate and forming a conductive shield layer at a position over the thin film transistor and under the pixel electrode, said method comprising:
    a first planarization step of forming a first planarization film to bury an irregular contour of the thin film transistor;
    a first processing step of forming the shield layer on the first planarization film;
    a second planarization step of forming a second planarization film to bury steps of the shield layer; and
    a second processing step of forming the pixel electrode on the second planarization film, and further comprising:
        a terminal region forming step of forming a terminal region for electrical connection and forming, in the terminal region, a contact-hole portion opened in the first planarization film and a flat surface portion surrounding the contact-hole portion;
        wherein said first processing step comprises the step of connecting a metal conductive layer constituting the shield layer to an underlying interconnection via the contact-hole portion; and
        said second processing step comprises the step of joining a transparent conductive layer constituting the pixel electrode to the metal conductive layer on the flat surface portion from which the second planarization film is removed.

2. A method of fabricating a display according to claim 1, wherein said first planarization step comprises the step of forming an insulating film and planarizing the surface of the insulating film by chemical-mechanical polishing.

3. A method of fabricating a display according to claim 1, wherein said first planarization step comprises the step of smoothly applying an insulating material by spin-coating and baking the insulating material.

4. A method of fabricating a display according to claim 1, wherein said second planarization step comprises the step of forming an insulating film and planarizing the surface of the insulating film by chemical-mechanical polishing.

5. A method of fabricating a display according to claim 1, wherein said second planarization step comprises the step of smoothly applying an insulating material by spin-coating and baking the insulating material.

6. A method of fabricating a display according to claim 1, wherein said second planarization step comprises the step of applying an organic resin.

7. A method of fabricating a display according to claim 1, wherein said terminal region forming step comprises the step of forming the contact hole portion having an opening area of 100 $\mu m^2$ or less.

8. A method of fabricating a display according to claim 1, wherein said terminal region forming step comprises the step of forming a plurality of the contact-hole portions in the terminal region in such a manner that the contact-hole portions are separated from each other by means of the flat surface portion.

9. A method of fabricating a display according to claim 1, wherein said terminal region forming step comprises the step of removing the second planarization film from the flat surface portion and making at least part of the second planarization film remain in the contact-hole portion.

10. A method of fabricating a display according to claim 1, further comprising:
    an assembling step of joining a substrate in which a counter electrode is previously formed to the substrate in which the pixel electrode has been formed with a specific gap put therebetween, and holding a liquid crystal in the gap.

* * * * *